(12) United States Patent
Nobile

(10) Patent No.: US 7,667,965 B2
(45) Date of Patent: Feb. 23, 2010

(54) ACOUSTICALLY ABSORPTIVE ANTI-RECIRCULATION PANEL FOR ONE OR MORE ELECTRONICS RACKS OF A DATA CENTER

(75) Inventor: Matthew A. Nobile, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 136 days.

(21) Appl. No.: 11/942,775

(22) Filed: Nov. 20, 2007

(65) Prior Publication Data

US 2009/0129015 A1 May 21, 2009

(51) Int. Cl.
*H05K 7/20* (2006.01)
(52) U.S. Cl. ............... 361/695; 181/202; 454/184; 312/213
(58) Field of Classification Search ............ 361/695, 361/690, 691, 692, 694, 696, 699; 181/54, 181/198, 200, 201, 202, 203, 205; 312/213, 312/236, 223.1; 174/16.1; 454/184; 165/80.3
See application file for complete search history.

(56) References Cited

U.S. PATENT DOCUMENTS

| | | | |
|---|---|---|---|
| 3,192,306 A * | 6/1965 | Skonnord | 174/16.1 |
| 6,104,608 A | 8/2000 | Casinelli | |
| 6,481,527 B1 | 11/2002 | French | |
| 6,927,977 B2 * | 8/2005 | Singer | 361/695 |
| 7,349,209 B2 * | 3/2008 | Campbell et al. | 361/695 |
| 2003/0151894 A1 | 8/2003 | Singer | |
| 2006/0139877 A1 * | 6/2006 | Germagian et al. | 361/695 |
| 2006/0185931 A1 | 8/2006 | Kawar | |
| 2007/0064391 A1 * | 3/2007 | Lewis, II et al. | 361/695 |
| 2007/0135032 A1 * | 6/2007 | Wang | 454/184 |
| 2008/0318552 A1 * | 12/2008 | Zieman et al. | 361/695 |

OTHER PUBLICATIONS

"Inter-Rack Flow Seperator to Prevent Computer Rack Hot Exhaust Air Entry Into Cold Region at Rack Inlet of Computer Data Center Facilities", IBM, ip.com, Prior Art Database, ip.com No. IPCOM000137460D, pp. 1-4 (Jun. 20, 2006).

* cited by examiner

*Primary Examiner*—Jayprakash N Gandhi
*Assistant Examiner*—Courtney Smith
(74) *Attorney, Agent, or Firm*—Geraldine Monteleone, Esq.; Kevin P. Radigan, Esq.; Heslin Rothenberg Farley & Mesiti, P.C.

(57) ABSTRACT

An acoustically absorptive panel is provided configured to reside above multiple electronics racks disposed in a row within a data center. The acoustically absorptive panel is configured to extend a height above the multiple electronics racks sufficient to at least partially block hot air recirculation from one or more air outlet sides of the multiple electronics racks to one or more air inlet sides of the electronics racks. The acoustically absorptive panel includes an acoustically absorptive material selected to attenuate noise, and in one embodiment, includes printed material on at least one side thereof related to one or more of the multiple electronics racks.

19 Claims, 7 Drawing Sheets

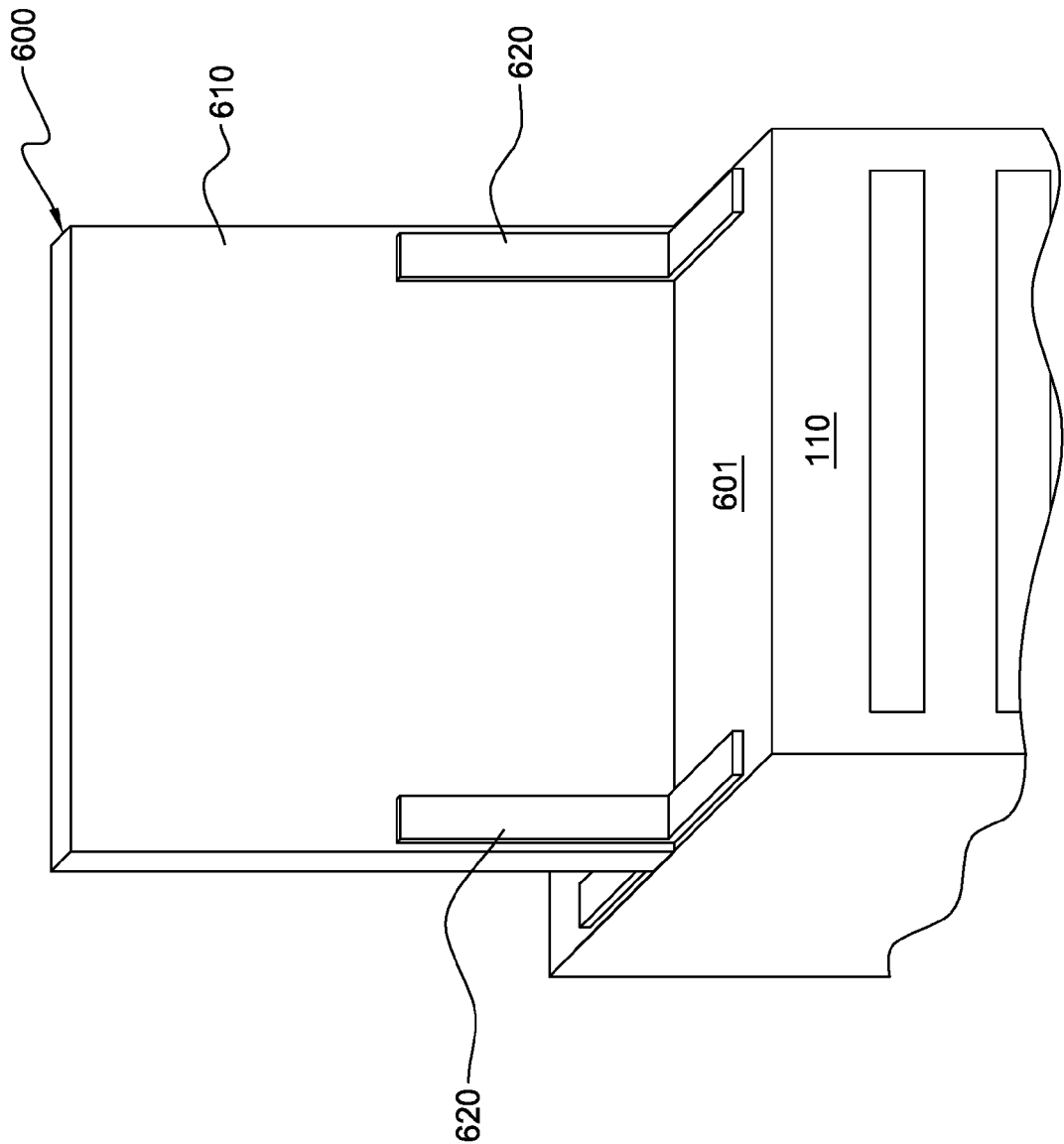

ACOUSTICALLY ABSORPTIVE ANTI-RECIRCULATION PANEL FOR ONE OR MORE ELECTRONICS RACKS OF A DATA CENTER

CROSS-REFERENCE TO RELATED APPLICATION

This application contains subject matter which is related to the subject matter of the following application entitled, "Recirculation Arresters for One or More Electronics Racks of a Data Center", by Hoeft et al., co-filed herewith Ser. No. 11/942,815, which is assigned to the same assignee as this application and which is hereby incorporated herein by reference in its entirety.

TECHNICAL FIELD

The present invention relates in general to apparatuses for facilitating cooling of rack-mounted assemblages of individual electronics units, such as rack-mounted computer server units, and to apparatuses for attenuating noise within a data center containing a plurality of electronics racks.

BACKGROUND OF THE INVENTION

The power dissipation of integrated circuit chips, and the modules containing the chips, continues to increase in order to achieve increases in processor performance. This trend poses a cooling challenge at both the module and system level. Increased airflow rates are needed to effectively cool high power modules and to limit the temperature of the air that is exhausted into the computer center.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer by providing greater airflow, through the use of a more powerful air moving device or by increasing the rotational speed (i.e., RPMs) of an existing air moving device. However, this approach is becoming problematic at the rack level in the context of a computer installation (i.e., a data center).

The sensible heat load carried by the air exiting the rack is stressing the ability of the room air-conditioning to effectively handle the load. This is especially true for large installations with "server farms" or large banks of electronics racks close together. In such installations not only will the room air-conditioning be challenged, but the situation may also result in recirculation problems with some fraction of the "hot" air exiting one rack unit being drawn into the air inlet of the same rack or a nearby rack. This recirculating flow is often extremely complex in nature, and can lead to significantly higher rack inlet temperatures than expected. This increase in cooling air temperature may result in components exceeding their allowable operating temperature and in a reduction in long term reliability of the components.

In addition, with the large number of electronics racks in many data center installations, the acoustic noise generated by both the fans in the electronics racks circulating air through the racks, and the fans of the computer room air conditioning units required to cool the data center are rising to unacceptably high levels.

SUMMARY OF THE INVENTION

The shortcomings of the prior art are overcome and additional advantages are provided herein through the provision of an apparatus which includes an acoustically absorptive panel configured to reside above at least one electronics rack. Air moves through each electronics rack of the at least one electronics rack from an air inlet side to an air outlet side thereof, and the acoustically absorptive panel is configured to extend a height above the at least one electronics rack sufficient to at least partially block hot air recirculation from at least one air outlet side of the at least one electronics rack to at least one air inlet side of the at least one electronics rack. Additionally, the acoustically absorptive panel includes an acoustically absorptive material which is selected to attenuate noise.

In another aspect, an apparatus is provided which includes an acoustically absorptive panel configured to reside above multiple electronics racks disposed in a row. Air moves through each electronics rack of the multiple electronics racks from an air inlet side to an air outlet side thereof, and the acoustically absorptive panel is configured to extend a height above the multiple electronics racks sufficient to at least partially block hot air recirculation from one or more air outlet sides of the multiple electronics racks to one or more air inlet sides of the multiple electronics racks. Additionally, the acoustically absorptive panel includes an acoustically absorptive material selected to attenuate noise, and includes printed material on at least one side thereof. The printed material is related to one or more of the multiple electronics racks, and in one embodiment, has a length which extends over at least two electronics racks of the multiple electronics racks.

In a further aspect, a data center is disclosed herein which includes multiple electronics racks disposed in a row, and at least one acoustically absorptive panel disposed above the multiple electronics racks. Each electronics rack includes at least one electronics subsystem requiring cooling, and at least one air-moving device. The at least one air-moving device causes external air to flow from an air inlet side of the electronics rack, across the at least one electronics subsystem, to an air outlet side of the electronics rack. The at least one acoustically absorptive panel extends a height above the multiple electronics racks sufficient to at least partially block hot air recirculation from one or more air outlet sides of the multiple electronics racks to one or more air inlet sides of the multiple electronics racks, and the acoustically absorptive panel includes an acoustically absorptive material selected to attenuate noise.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 6 depicts one embodiment of an apparatus comprising an acoustically absorptive panel configured to stand vertically on top of an electronics rack using multiple L-shaped brackets, in accordance with an aspect of the present invention.

DETAILED DESCRIPTION OF THE INVENTION

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand alone computer processor having high, mid or low end processing capability. In one embodiment, an electronics rack may comprise multiple electronics subsystems or drawers, each having one or more heat generating components disposed therein requiring cooling. "Electronics subsystem" refers to any sub-housing, blade, book, drawer, node, compartment, etc., having one or more heat generating electronic components disposed therein. Each electronics subsystem of an electronics rack may be movable or fixed relative to the electronics rack, with the electronics drawers of a multi-drawer rack unit and blades of a blade center system being two examples of electronics subsystems of an electronics rack to be cooled. Further, "data center" refers to a computer installation containing one or more electronics racks to be cooled. As a specific example, a data center may include one or more rows of rack-mounted computing units, such as server units.

Reference is made below to the drawings, which are not drawn to scale for reasons of understanding, wherein the same reference numbers used throughout different figures designate the same or similar components.

Figure 1:
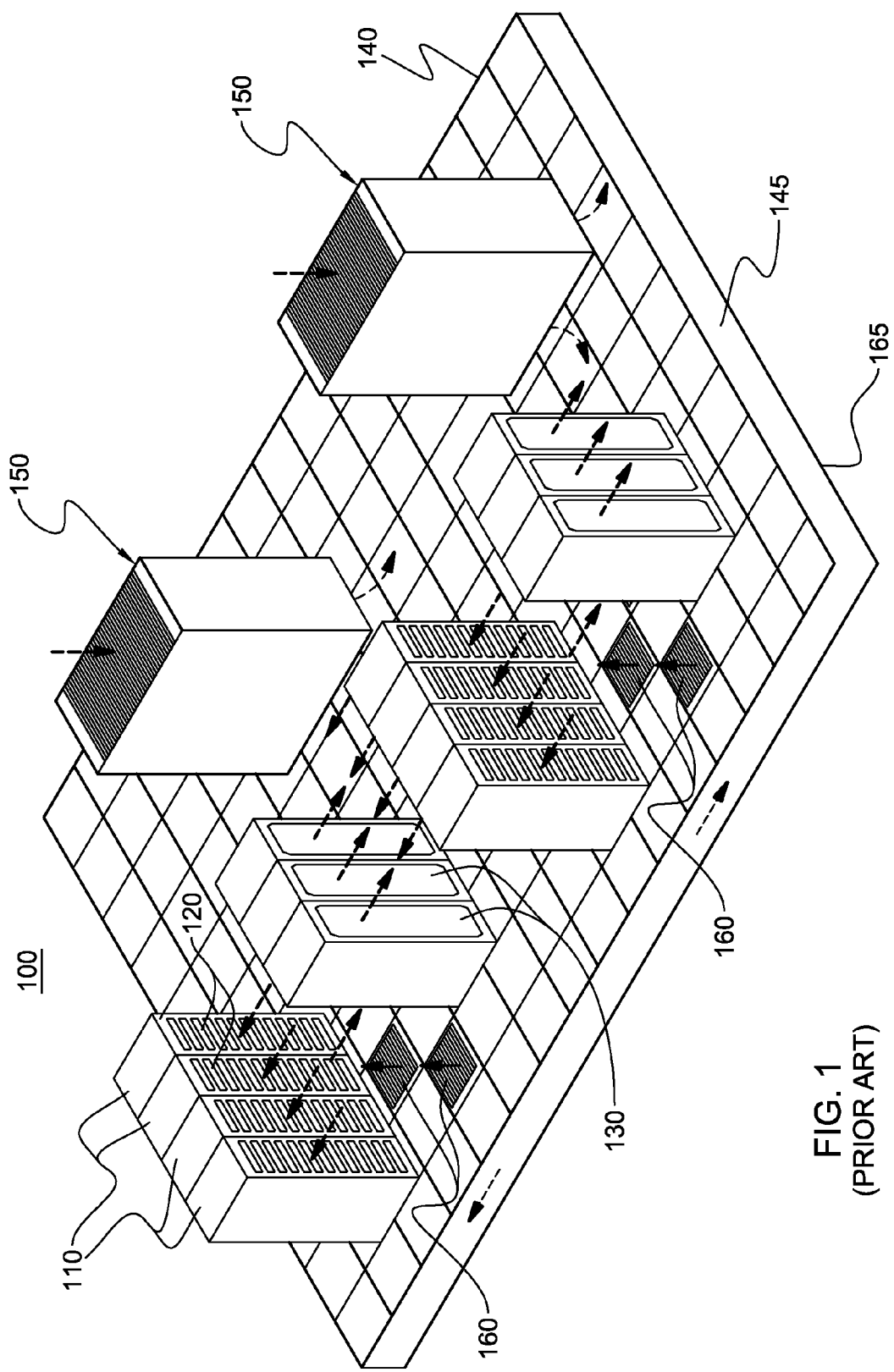
FIG. 1 depicts one embodiment of a conventional raised floor layout of an air-cooled data center.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within the data center 100. Room air is taken into each air conditioning unit 150 near an upper portion thereof. This room air comprises in part exhausted air from the "hot" aisles of the computer installation defined by opposing air outlet sides 130 of the electronics racks 110.

Figure 2:
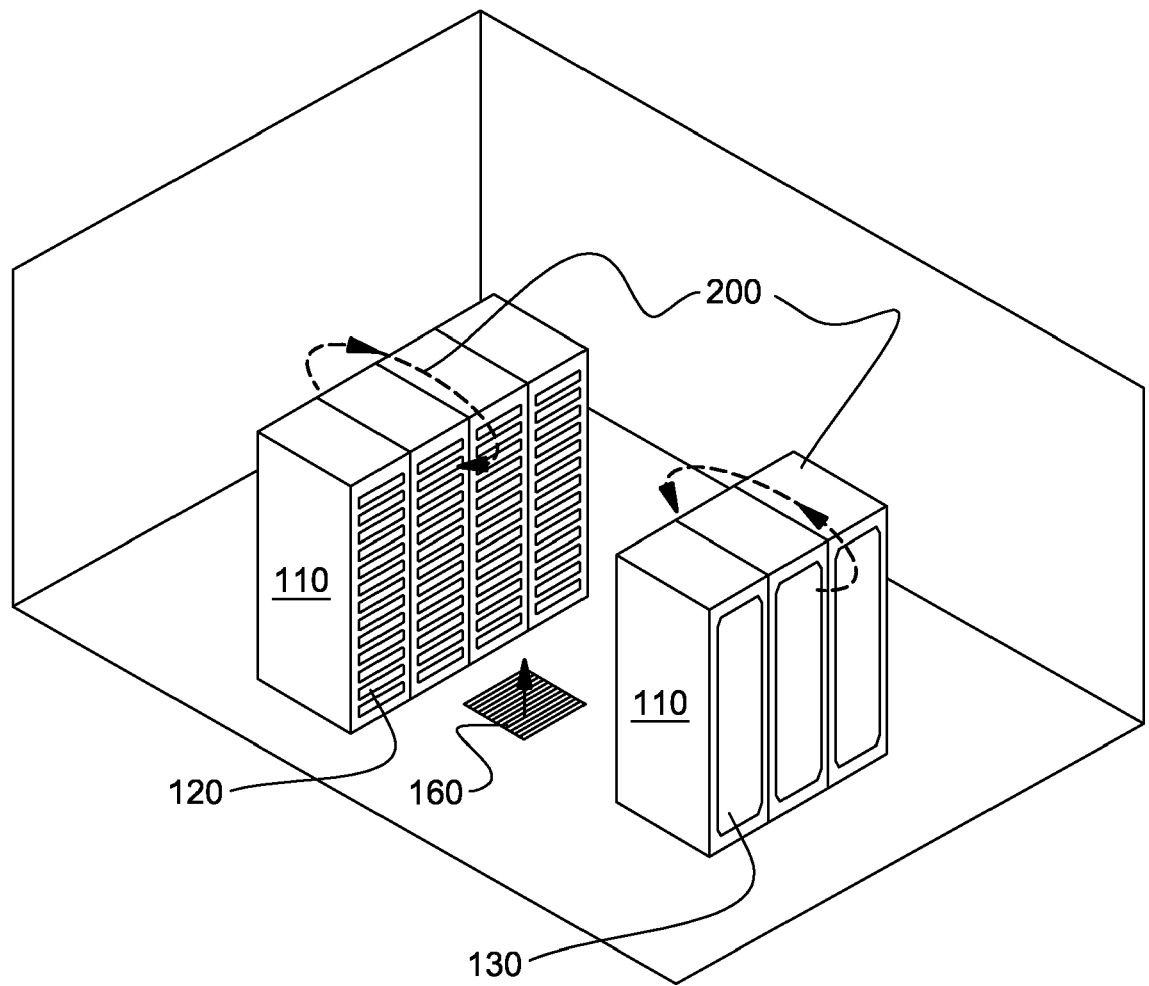
FIG. 2 depicts one problem addressed by the present invention, showing recirculation airflow patterns (in one implementation of a raised floor layout of an air-cooled data center) to be addressed by the apparatuses disclosed herein, in accordance with an aspect of the present invention.

Due to the ever increasing airflow requirements through electronics racks, and limits of air distribution within the typical data center installation, recirculation problems within the room may occur. This is shown in FIG. 2 for a raised floor layout, wherein hot air recirculation 200 occurs from the air outlet sides 130 of the electronics racks 110 back to the cold air aisle defined by the opposing air inlet sides 120 of the electronics racks. This recirculation can occur because the conditioned air supplied through tiles 160 is typically only a fraction of the airflow rate forced through the electronics racks by the air moving devices disposed therein. This can be due, for example, to limitations on the tile sizes (or diffuser flow rates). The remaining fraction of the supply of inlet side air is often made up by ambient room air through recirculation 200. This recirculating flow is often very complex in nature, and can lead to significantly higher rack unit inlet temperatures than desired.

The recirculation of hot exhaust air from the hot aisle of the computer room installation to the cold aisle can be detrimental to the performance and reliability of the computer system(s) or electronic system(s) within the racks. Data center equipment is typically designed to operate with rack air inlet temperatures in the 18-35° C. range. For a raised floor layout such as depicted in FIG. 1, however, temperatures can range from 15-20° C. at the lower portion of the rack, close to the cooled air input floor vents, to as much as 45-50° C. at the upper portion of the electronics rack, where the hot air can form a self-sustaining recirculation loop. Since the allowable rack heat load is limited by the rack inlet air temperature at the "hot" part, this temperature distribution correlates to an inefficient utilization of available chilled air. Also, computer installation equipment almost always represents a high capital investment to the customer. Thus, it is of significant importance, from a product reliability and performance view point, and from a customer satisfaction and business perspective, to establish a substantially uniform temperature across the air inlet side of the rack unit. The efficient cooling of such computer and electronic systems, and the amelioration of localized hot air inlet temperatures to one or more rack units due to recirculation of air currents, are addressed by the apparatuses and methods disclosed herein, as is reducing acoustic noise within the data center. Traditionally, higher air inlet temperatures to electronics racks have been addressed by increasing fan speeds within the rack units, however, this causes an increase in noise level within the data center. This is problematic since noise levels within the data center are already too high.

Figure 3A:
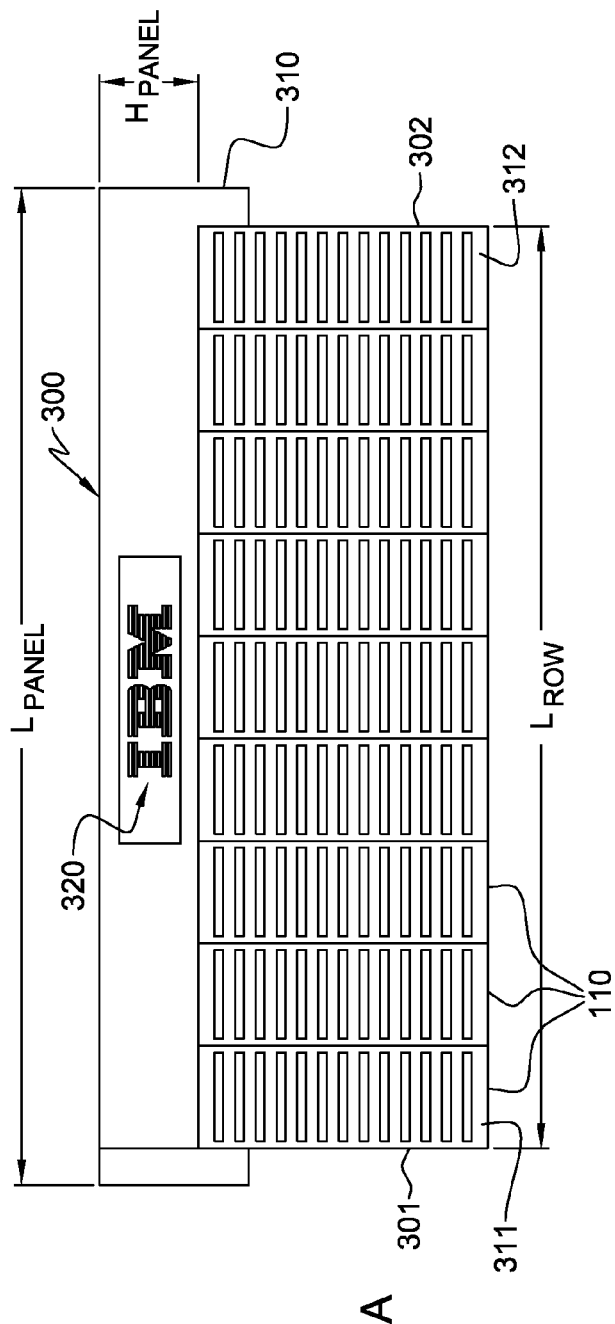
FIG. 3A is an elevational view of an assembly comprising multiple electronics racks disposed in a row, with an acoustically absorptive panel disposed above the multiple electronics racks which is sized to at least partially block hot air recirculation from the air outlet sides thereof to the air inlet sides, in accordance with an aspect of the present invention.
Figure 3B:
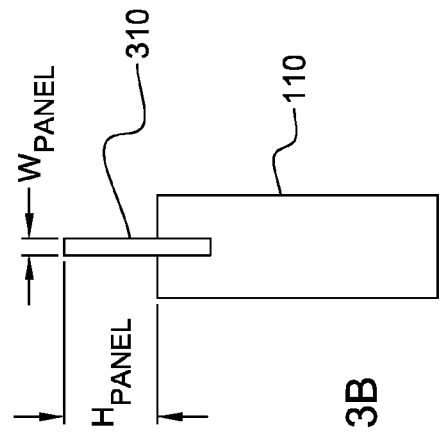
FIG. 3B is an end elevational view of the assembly of FIG. 3A, in accordance with an aspect of the present invention.

FIGS. 3A & 3B depict one embodiment of an apparatus, generally denoted 300, in accordance with an aspect of the present invention. In this embodiment, apparatus 300 includes an acoustically absorptive panel 310 configured to reside above multiple electronics racks 110 disposed in a row, as illustrated. As noted above, air moves through each electronics rack of the multiple electronics racks from an air inlet side to an air outlet side thereof. The acoustically absorptive panel is configured to extend a height $H_{panel}$ above electronics racks 110 sufficient to at least partially block hot air recirculation from one or more air outlet sides of the multiple electronics racks to one or more air inlet sides thereof. The at least partial blocking of hot air recirculation from the air outlet sides to the air inlet sides of the electronics racks is such as to reduce or minimize the amount of hot air recirculation. In one embodiment, the height $H_{panel}$ is sufficient to achieve this at least partial blocking of hot air recirculation. In one specific example, electronics racks 110 may be approximately six feet high, and height $H_{panel}$ of acoustically absorptive panel 310 may be two feet or more.

As explained further below, acoustically absorptive panel 310 comprises an acoustically absorptive material selected to attenuate noise, for example, to attenuate noise within the data center containing the row of multiple electronics racks 110. Additionally, in one embodiment, the acoustically absorptive panel 310 includes printed material 320 on at least one side thereof. The printed material is again, in one embodiment, related to one or more of the multiple electronics racks 110 disposed in the row. In the example of FIG. 3A, the printed material is an advertisement for International Business Machines Corporation, of Armonk, N.Y., a manufacturer of electronics racks such as described herein. Further, in the illustrated embodiment, the printed material extends over two or more of the electronics racks disposed within the row.

As illustrated in FIGS. 3A & 3B, acoustically absorptive panel 310 includes a width $W_{panel}$ of sufficient size to allow the acoustically absorptive panel to stand on top of the multiple electronics racks. Further, acoustically absorptive panel 310 is configured with a length $L_{panel}$ which is greater than a length $L_{row}$ of the row of the multiple electronics racks so that the acoustically absorptive panel extends past a first end 301 and a second end 302 of the row to facilitate blocking of hot air recirculation at first end 301 and second end 302. Additionally, acoustically absorptive panel 310 is shown to extend at least partially down a side of electronics rack 311 at first end 301 of the row and at least partially down a side of a second electronics rack 312 at second end 302 of the row. This partial extension down the sides of the electronics racks at the ends of the row further facilitates blocking of hot air recirculation to the air inlet sides of the racks, and further facilitates placement and retaining of the acoustically absorptive panel on top of the multiple electronics racks. In one embodiment, the acoustically absorptive panel is sized for a particular type and number of electronics racks disposed within a row. By appropriately selecting the width $W_{panel}$, the acoustically absorptive panel may simply be placed over the tops of the multiple electronics racks disposed in the row and rest vertically thereon as illustrated.

In an alternate implementation, the acoustically absorptive panel could be adjustable along its length for employing with various rows of different numbers of electronics racks. For example, the panel could be fabricated in a slide-rule adjustable manner to accommodate different numbers of rack units in a row.

Figure 4:
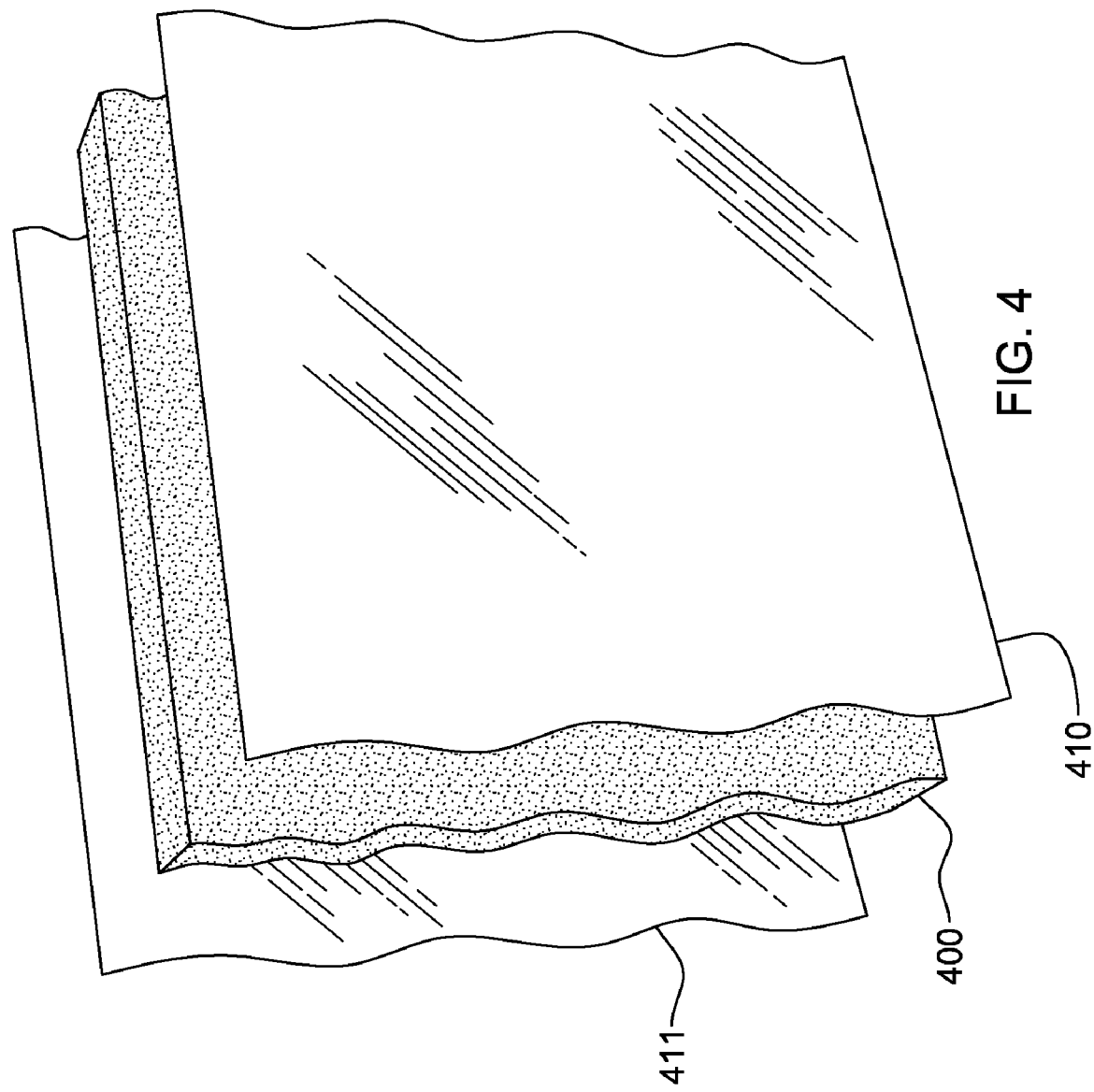
FIG. 4 is an exploded partial view of one embodiment of an acoustically absorptive panel, in accordance with an aspect of the present invention.

FIG. 4 illustrates one embodiment of an acoustically absorptive panel construction. In this embodiment, the acoustically absorptive panel comprises an acoustically absorptive core material 400 covered on a first side and a second side by a fabric 410, 411, such as an acoustically transparent fabric. In one embodiment, the fabric can receive printed material, for example, an advertisement or trademark, as illustrated in FIG. 3A. In one example, the acoustically absorptive core material comprises fiberglass or polyurethane foam.

Figure 5A:
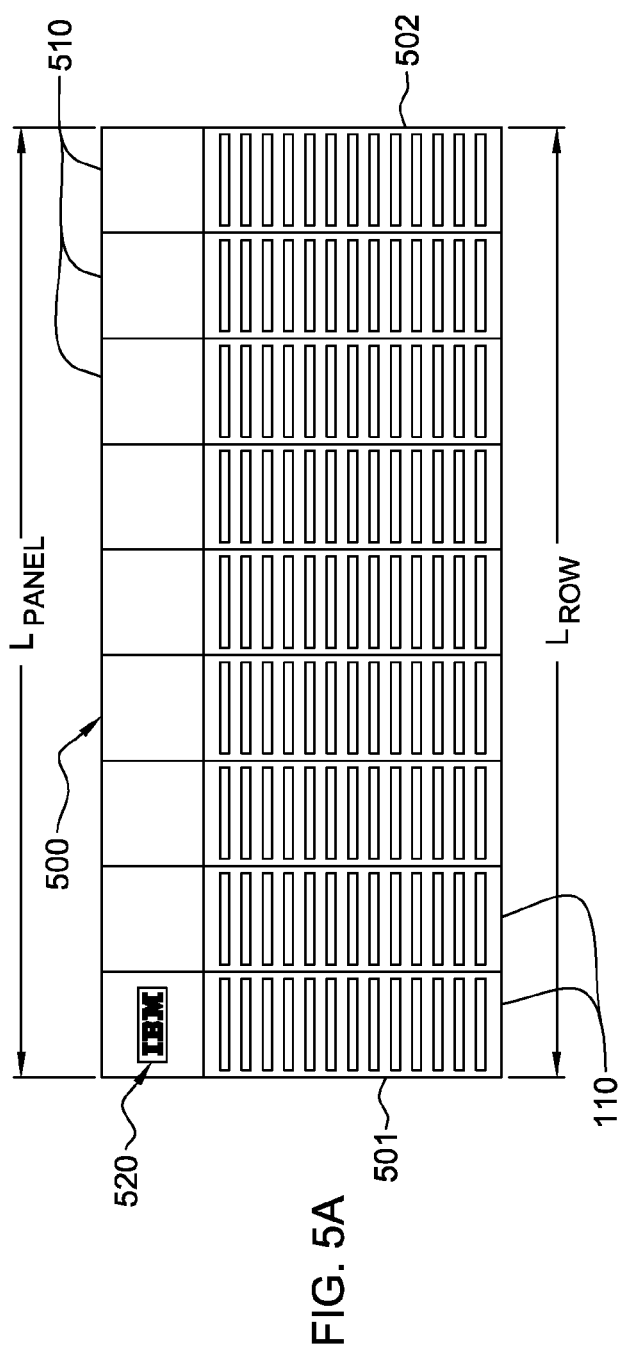
FIG. 5A depicts an alternate embodiment of an assembly comprising multiple electronics racks disposed in a row, with multiple acoustically absorptive panel sections disposed above the multiple electronics racks, in accordance with an aspect of the present invention.
Figure 5B:
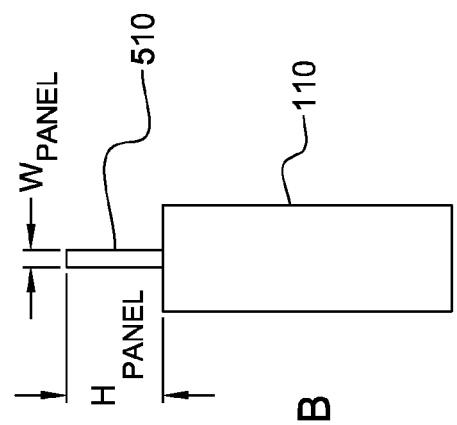
FIG. 5B is an end elevational view of the assembly of FIG. 5A, in accordance with an aspect of the present invention.

FIGS. 5A & 5B depict an alternate embodiment of an apparatus 500, in accordance with an aspect of the present invention. In this embodiment, apparatus 500 is modular in design for scalability, with multiple acoustically absorptive panel sections 510 being employed, which when aligned on top of the multiple electronics racks 110 disposed in the row, form the acoustically absorptive panel. Each acoustically absorptive panel section 510 is sized in this example to approximately the width of the respective electronics rack 110 on top of which the panel is to reside. Thus, the overall length $L_{panel}$ of the acoustically absorptive panel is equal to the length $L_{row}$ of the row of electronics racks. As shown, printed material 520 may be disposed on one or more of the acoustically absorptive panel sections 510, and the height $H_{panel}$ of each acoustically absorptive panel 510 is again selected to at least partially block hot air recirculation from one or more air outlet sides of the multiple electronics racks to one or more air inlet sides thereof. In an alternate configuration, the acoustically absorptive panel sections 510 disposed at the ends 501, 502 of the row of multiple electronics racks may be configured differently from the other panel sections aligned above the row. For example, the end panel sections could comprise a length which extends past the ends 501, 502 of the row of electronics racks, or be configured as L-shaped in order to extend past and down the ends 501, 502 of the row, similarly to the embodiment depicted in FIGS. 3A & 3B.

FIG. 6 depicts an alternate embodiment of an apparatus, generally denoted 600, which includes an acoustically absorptive panel 610 and multiple L-shaped brackets 620 affixed to acoustically absorptive panel 610 via any appropriate fastener. The L-shaped brackets 620 allow the acoustically absorptive panel 610 to stand vertically atop upper surface 601 of electronics rack 110, as illustrated. In this embodiment, acoustically absorptive panel 610 is again sized to approximately the width of the respective electronics rack 110 and has a height configured to extend above the electronics rack a sufficient amount to at least partially block hot air recirculation from, for example, the air outlet side of the electronics rack to the air inlet side thereof. Further, the acoustically absorptive panel includes an acoustically absorptive material, such as the acoustically absorptive core material depicted in FIG. 4. Further, the acoustically absorptive panel may include printed material, such as an advertisement or logo for a manufacturer of the electronics rack, as described above in connection with FIGS. 3A & 5A. In one embodiment, L-shaped brackets 620 may be metal brackets pre-fastened to the modular acoustically absorptive panel section 610 to allow the panel section to stand vertically atop the electronics rack. These L-shaped brackets may also be employed in implementations such as described above in connection with FIGS. 3A, 3B & 5A, 5B, depending upon the width of the acoustically absorptive panel.

Figure 7:
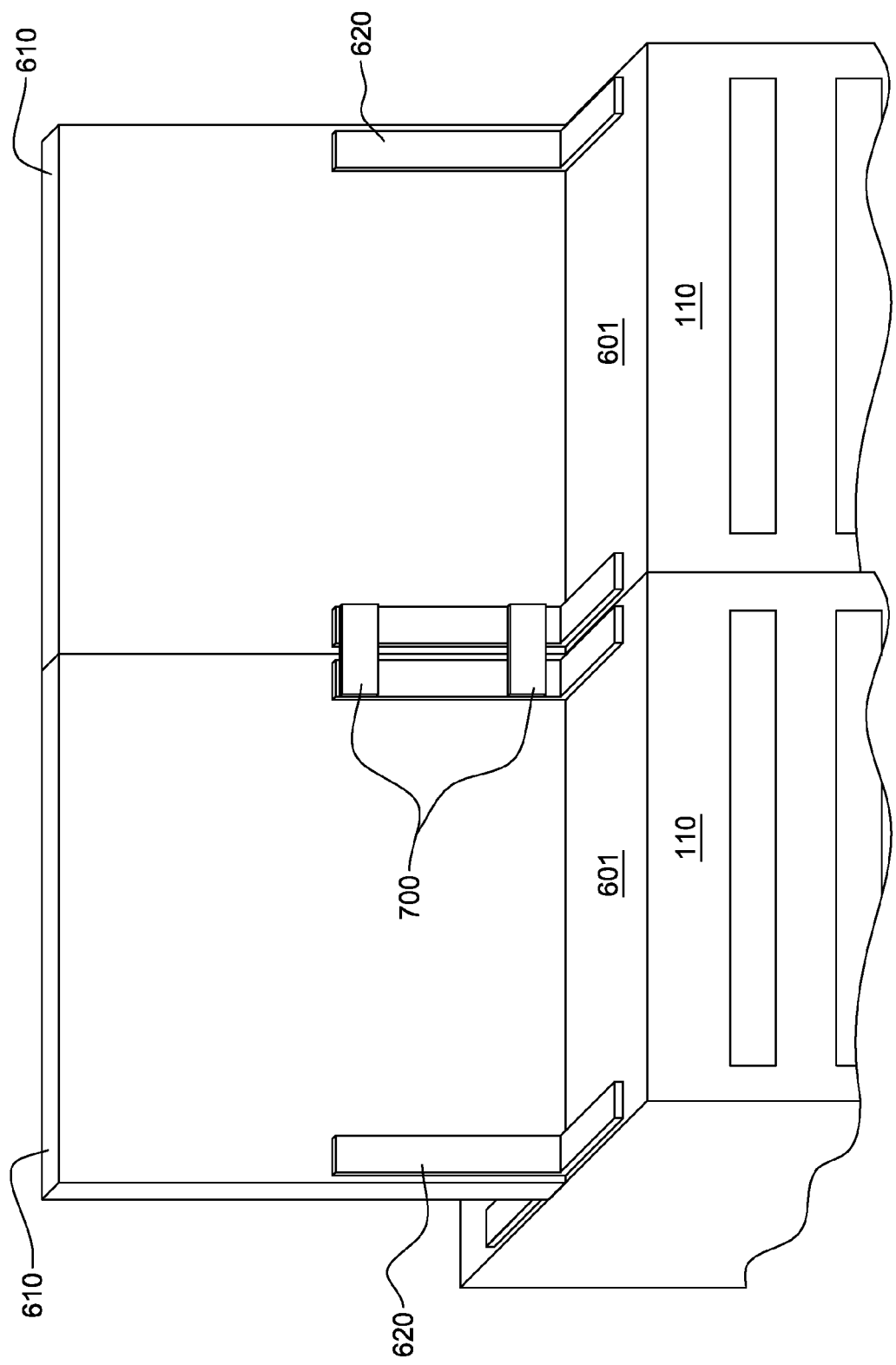
FIG. 7 depicts one embodiment of an apparatus comprising multiple adjacent acoustically absorptive panel sections connected together and disposed on top of adjacent electronics racks of a row of electronics racks, in accordance with an aspect of the present invention.

FIG. 7 depicts two adjacent electronics racks 110, each having a modular acoustically absorptive panel section 610 disposed on an upper surface 601 thereof. As illustrated, each panel section again includes L-shaped brackets 620 which allow the panel section to extend vertically from the upper surface of the electronics rack upon which the panel section resides. In this implementation, the modular acoustically absorptive panel sections are aligned with their edges abutting and with one or more connectors 700 being employed to maintain the panel sections aligned. In one implementation, connectors 700 may be simple flat brackets, such as metal brackets, strapped and secured across the adjacent L-shaped brackets, as illustrated. In alternate implementations, other connector types may be employed. For example, the edges of abutting panel sections could be fitted with tongue-in-groove elements to maintain the panel sections aligned and interconnected on top of adjacent electronics racks.

Those skilled in the art will note from the above description that provided herein are various apparatuses which facilitate thermal performance of one or more electronics racks within a data center, and which also function to reduce noise levels within the data center, and which may be used, for example, as a marketing tool by allowing for inclusion of printed material, such as a logo of a manufacturer of one or more electronics racks to be placed on top of the one or more electronics racks.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. An apparatus comprising:
an acoustically absorptive barrier panel residing above multiple electronics racks, wherein room air moves through each electronics rack of the at least one electronics rack from an air inlet side to an air outlet side thereof, the air inlet side and the air outlet side of each electronics rack being opposing sides of the electronics rack, and wherein the acoustically absorptive barrier panel extends a height above the electronics racks and a width across the electronics racks sufficient to block hot air exiting into the room from the outlet side of the electronics racks from recirculating across a top of the electronics racks to the air inlet side of the electronics racks, and wherein the acoustically absorptive barrier panel comprises multiple layers, the multiple layers comprising an acoustically absorptive core material selected to attenuate noise emanating, in part, from the electronics racks; and wherein the acoustically absorptive barrier panel comprises multiple acoustically absorptive barrier panel sections, each acoustically absorptive barrier panel section being sized to reside above a respective electronics rack of the multiple electronics racks, and wherein each of the barrier panel sections further comprise multiple connectors connecting the multiple acoustically absorptive barrier panel sections together to form the acoustically absorptive barrier panel disposed above the multiple electronics racks.

2. The apparatus of claim 1, wherein the acoustically absorptive barrier panel includes printed material on at least one side thereof, the printed material being related to at least one of the electronics racks, and wherein the multiple layers further comprise a fabric covering the acoustically absorptive core material, the fabric being an acoustically transparent fabric.

3. The apparatus of claim 2, wherein the acoustically absorptive core material comprises one of fiberglass or polyurethane foam.

4. The apparatus of claim 2, wherein the acoustically absorptive core material has a thickness greater than a thickness of the fabric covering the acoustically absorptive core material.

5. The apparatus of claim 2, wherein the acoustically absorptive barrier panel extends across multiple electronics racks in a row of a data center, and the acoustically absorptive barrier panel comprises a length extending past a first end and a second end of the multiple electronics racks disposed in the row to facilitate blocking of hot air recirculation at the first end and the second end of the multiple electronics racks disposed in the row.

6. The apparatus of claim 5, wherein the acoustically absorptive barrier panel extends at least partially down a first side of a first electronics rack at the first end of the multiple electronics racks disposed in the row and extends at least partially down a second side of a second electronics rack at the second end of the multiple electronics racks disposed in the row to facilitate blocking of hot air recirculation at the first end and second end of the multiple electronics racks disposed in the row.

7. The apparatus of claim 1, wherein the acoustically absorptive core material is covered on a first side and a second side by an acoustically transparent fabric.

8. The apparatus of claim 1, further comprising multiple L-shaped brackets affixed to the acoustically absorptive barrier panel for supporting the acoustically absorptive barrier panel in a fixed, standing position on an upper surface of the at least one electronics rack, wherein each L-shaped bracket of the multiple L-shaped brackets comprises a first bracket arm and a second bracket arm fixed perpendicular to each other, and wherein the acoustically absorptive barrier panel extends in perpendicular fixed relation to the upper surface of the at least one electronics rack, and wherein at least one L-shaped bracket of the multiple L-shaped brackets couples a first side of the acoustically absorptive barrier panel to the upper surface of the at least one electronics rack, and at least one other L-shaped bracket of the multiple L-shaped brackets couples a second side of the acoustically absorptive barrier panel to the upper-surface of the at least one electronics rack.

9. An apparatus comprising:
an acoustically absorptive barrier panel residing above multiple electronics racks disposed in a row, wherein room air moves through each electronics rack of the multiple electronics racks from an air inlet side to an air outlet side thereof, the air inlet side and the air outlet side of each electronics rack being opposing sides of the electronics rack, and wherein the acoustically absorptive barrier panel extends a height above the multiple electronics racks and a width across the multiple electronics racks sufficient to block hot air exiting into the room from one or more air outlet sides of the multiple electronics racks from recirculating across a top of the multiple electronics racks to one or more air inlet sides of the multiple electronics racks; and
wherein the acoustically absorptive barrier panel comprises multiple layers, the multiple layers comprising an acoustically absorptive core material selected to attenuate noise emanating, in part, from the multiple electronics racks, and includes printed material on at least one side thereof, the printed material being related to one or more of the multiple electronics racks, and wherein the printed material comprises a length which extends over at least two electronics racks of the multiple electronics racks; and wherein the acoustically absorptive barrier panel comprises multiple acoustically absorptive barrier panel sections, each acoustically absorptive barrier panel section being sized to reside above a respective electronics rack of the multiple electronics racks, and wherein each of the barrier panel sections further comprise multiple connectors connecting the multiple acoustically absorptive barrier panel sections together to form the acoustically absorptive barrier panel disposed above the multiple electronics racks.

10. The apparatus of claim 9, wherein the printed material comprises an advertisement for a manufacturer of one or more of the multiple electronics racks, and wherein the acoustically absorptive barrier panel comprises a length at least equal to a length of the row of multiple electronics racks, and wherein the acoustically absorptive barrier panel is configured to free-stand without support on top of the multiple electronics racks disposed in the row and extend vertically from upper surfaces thereof.

11. The apparatus of claim 9, wherein the multiple layers further comprise a fabric covering the acoustically absorptive core material, the fabric being an acoustically transparent fabric, and wherein the acoustically absorptive barrier panel comprises one of fiberglass or polyurethane foam.

12. The apparatus of claim 9, wherein the acoustically absorptive barrier panel comprises multiple acoustically absorptive panel sections, each acoustically absorptive panel section being configured to reside above a respective electronics rack of the multiple electronics racks disposed in the row, and wherein the apparatus further comprises multiple connectors for securing adjacent acoustically absorptive panel sections together to form the acoustically absorptive barrier panel.

13. The apparatus of claim 12, further comprising multiple L-shaped brackets affixed to each acoustically absorptive barrier panel section for supporting the acoustically absorptive barrier panel section in a fixed, standing position on an upper surface of the respective electronics rack, wherein each L-shaped bracket of the multiple L-shaped brackets comprises a first bracket arm and a second bracket arm fixed perpendicular to each other, and wherein the acoustically absorptive barrier panel extends in perpendicular fixed relation to upper surfaces of the multiple electronics racks, and wherein at least one L-shaped bracket of the multiple L-shaped brackets couples a first side of the acoustically absorptive barrier panel to the upper surface of at least one electronics rack of the multiple electronics racks, and at least one other L-shaped bracket of the multiple L-shaped brackets couples a second side of the acoustically absorptive barrier panel to the upper surface of at least one electronics rack of the multiple electronics racks.

14. A data center comprising:
multiple electronics racks disposed in a row, each electronics rack of the multiple electronics racks comprising at least one electronics subsystem requiring cooling, and at least one air-moving device, the at least one air-moving device causing external air to flow from an air inlet side of the electronics rack, across the at least one electronics subsystem to an air outlet side of the electronics rack, the air inlet side and the air outlet side of each electronics rack being opposing sides of the electronics rack; and
at least one acoustically absorptive barrier panel disposed above the multiple electronics racks, wherein the at least one acoustically absorptive barrier panel extends a height above the multiple electronics racks and a width across the multiple electronics racks sufficient to block hot air exiting from one or more air outlet sides of the multiple electronics racks from recirculating across the tops of the multiple electronics racks to one or more air inlet sides of the multiple electronics racks, and wherein the acoustically absorptive barrier panel comprises multiple layers, the multiple layers comprising an acoustically absorptive core material selected to attenuate noise emanating, in part, from the multiple electronics racks; and wherein the acoustically absorptive barrier panel comprises multiple acoustically absorptive barrier panel sections, each acoustically absorptive barrier panel section being sized to reside above a respective electronics rack of the multiple electronics racks, and wherein each of the barrier panel sections further comprise multiple connectors connecting the multiple acoustically absorptive barrier panel sections together to form the acoustically absorptive barrier panel disposed above the multiple electronics racks.

15. The data center of claim 14, wherein the at least one acoustically absorptive barrier panel includes printed material on at least one side thereof, the printed material being related to one or more electronics racks of the multiple electronics racks, and wherein the multiple layers further comprise a fabric covering the acoustically absorptive core material, the fabric being an acoustically transparent fabric.

16. The data center of claim 15, wherein the printed material comprises an advertisement for a manufacturer of one or more of the multiple electronics racks, and the printed material comprises a length which extends over at least two electronics racks of the multiple electronics racks, and wherein the acoustically absorptive core material comprises one of fiberglass or polyurethane foam.

17. The data center of claim 14, wherein the acoustically absorptive core material is covered on a first side and a second side by an acoustically transparent fabric.

18. The data center of claim 14, wherein the at least one acoustically absorptive barrier panel comprises a length which extends past a first end and a second end of the multiple electronics racks disposed in the row to facilitate blocking of hot air recirculation at the first end and the second end of the multiple electronics racks disposed in the row.

19. The data center of claim 14, further comprising multiple L-shaped brackets affixed to the multiple acoustically absorptive barrier panel sections for supporting the at least one acoustically absorptive barrier panel in a fixed, standing position on top of upper surfaces of the multiple electronics racks disposed in the row, wherein each L-shaped bracket of the multiple L-shaped brackets comprises a first bracket arm and a second bracket arm fixed perpendicular to each other, and wherein the at least one acoustically absorptive barrier panel extends in perpendicular fixed relation to the upper surfaces of the multiple electronics racks, and wherein at least one L-shaped bracket of the multiple L-shaped brackets couples a first side of the at least one acoustically absorptive barrier panel to the upper surface of at least one electronics rack of the multiple electronics racks, and at least one other L-shaped bracket of the multiple L-shaped brackets couples a second side of the at least one acoustically absorptive barrier panel to the upper surface of at least one electronics rack of the multiple electronics racks.

* * * * *